(12) United States Patent
Sato et al.

(10) Patent No.: US 12,020,930 B2
(45) Date of Patent: Jun. 25, 2024

(54) NITRIDE SEMICONDUCTOR ELEMENT

(71) Applicant: ASAHI KASEI KABUSHIKI KAISHA, Tokyo (JP)

(72) Inventors: Kosuke Sato, Tokyo (JP); Motoaki Iwaya, Nagoya (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 98 days.

(21) Appl. No.: 17/205,333

(22) Filed: Mar. 18, 2021

(65) Prior Publication Data

US 2021/0366703 A1 Nov. 25, 2021

(30) Foreign Application Priority Data

May 20, 2020 (JP) ................. 2020-088316
Jan. 28, 2021 (JP) ................. 2021-012413

(51) Int. Cl.
*H01L 21/02* (2006.01)

(52) U.S. Cl.
CPC .... *H01L 21/0254* (2013.01); *H01L 21/02505* (2013.01)

(58) Field of Classification Search
None
See application file for complete search history.

(56) References Cited

U.S. PATENT DOCUMENTS

| | | | |
|---|---|---|---|
| 7,071,494 B2 * | 7/2006 | Steigerwald | H01L 33/22 257/E33.068 |
| 9,306,119 B2 | 4/2016 | Yamane | |
| 2003/0116767 A1 * | 6/2003 | Kneissl | H01S 5/34333 257/79 |
| 2008/0179623 A1 | 7/2008 | Tachibana et al. | |
| 2011/0309400 A1 | 12/2011 | Fukushima et al. | |
| 2012/0187365 A1 | 7/2012 | Jeong et al. | |
| 2012/0187369 A1 | 7/2012 | Jeong et al. | |
| 2012/0187370 A1 | 7/2012 | Jeong et al. | |
| 2013/0069033 A1 | 3/2013 | Kushibe et al. | |
| 2014/0138726 A1 | 5/2014 | Yamane | |
| 2014/0284550 A1 | 9/2014 | Kumagai | |

(Continued)

FOREIGN PATENT DOCUMENTS

| | | |
|---|---|---|
| JP | 2008-182069 A | 8/2008 |
| JP | 2010-205988 A | 9/2010 |

(Continued)

*Primary Examiner* — Kim S. Horger
(74) *Attorney, Agent, or Firm* — Morgan, Lewis & Bockius LLP

(57) ABSTRACT

Provided is a nitride semiconductor element that does not cause element breakdown even when driven at high current density. A nitride semiconductor element includes an active layer, an electron block layer formed above the active layer, an AlGaN layer formed on the electron block layer, and a cover layer covering an upper surface of the AlGaN layer and formed of AlGaN or GaN having a lower Al composition ratio than in the AlGaN layer, in which the AlGaN layer includes protrusions provided on a surface opposite to the active layer, and the cover layer covers the protrusions. The AlGaN layer is preferably formed of AlGaN having an Al composition ratio decreasing in a direction away from the active layer, and the protrusions preferably have a frustum shape.

20 Claims, 4 Drawing Sheets

(56) References Cited

U.S. PATENT DOCUMENTS

| | | | |
|---|---|---|---|
| 2015/0200329 A1 | 7/2015 | Jeong et al. | |
| 2016/0268477 A1 | 9/2016 | Fujita et al. | |
| 2016/0315224 A1* | 10/2016 | Komada | H01L 21/02505 |
| 2019/0148592 A1 | 5/2019 | Takeuchi et al. | |

FOREIGN PATENT DOCUMENTS

| | | |
|---|---|---|
| JP | 2012-156508 A | 8/2012 |
| JP | 2013-065632 A | 4/2013 |
| JP | 2014-103211 A | 6/2014 |
| JP | 2014-183285 A | 9/2014 |
| JP | 2016-171127 A | 9/2016 |
| JP | 2018-098401 A | 6/2018 |
| JP | 2019-087712 A | 6/2019 |

* cited by examiner

NITRIDE SEMICONDUCTOR ELEMENT

TECHNICAL FIELD

The present disclosure relates to a nitride semiconductor element.

BACKGROUND ART

In nitride semiconductor light emitting elements such as light emitting diodes (LEDs), a large current may be applied to increase output or the elements may be downsized to lower cost. Additionally, for example, in laser diodes, electrode area may be reduced to increase current density. In both cases, the elements need to be able to withstand being driven at higher current density. Then, for example, there have been proposed nitride semiconductor elements including a p-type clad layer formed of AlGaN in which an Al composition decreases in a thickness direction (for example, JP 2018-098401 A and JP 2016-171127 A). JP 2018-098401 A and JP 2016-171127 A disclose that compositionally grading the Al composition in the p-type AlGaN clad layer lowers a threshold current density and a threshold voltage for laser oscillation.

In addition, particularly in ultraviolet laser diodes, performing laser oscillation with light having a wavelength of less than 380 nm requires driving at a higher current density than in nitride semiconductor laser diodes having longer wavelengths than that. Particularly, among laser elements having a wavelength of 300 nm or less, a 271.8 nm wavelength laser diode and a 298 nm wavelength laser diode, whose realizations have been reported, respectively, require 25 kA/cm$^2$ and 41 kA/cm$^2$ in current density, which are high current densities exceeding 20 kA/cm$^2$. This is because laser oscillation requires a high threshold current density due to difficulty in growing a high-quality AlGaN thin film and due to significant difficulty in growing conductive AlGaN having a high Al composition required for light confinement.

SUMMARY OF INVENTION

It is an object of the present disclosure to provide a nitride semiconductor element that does not cause element breakdown even when driven at high current density.

In order to achieve the above object, a nitride semiconductor element according to one aspect of the present disclosure includes an active layer, an electron block layer formed above the active layer, an AlGaN layer formed on the electron block layer, and a cover layer covering an upper surface of the AlGaN layer and formed of AlGaN or GaN having a lower Al composition ratio than in the AlGaN layer, in which the AlGaN layer includes protrusions provided on a surface opposite to the active layer, and the cover layer covers the protrusions.

According to the one aspect of the present disclosure, there can be provided a nitride semiconductor element that does not cause element breakdown even when driven at high current density.

DESCRIPTION OF EMBODIMENTS

Hereinafter, nitride semiconductor elements according to present embodiments will be described through embodiments. However, the following embodiments are not intended to limit the invention according to the scope of the claims. Additionally, not all of the combinations of features described in the embodiments are always essential for the solving means of the invention.

1. First Embodiment

A nitride semiconductor element 1 according to a first embodiment will be described below with reference to FIGS. 1 and 2.

The nitride semiconductor element 1 is a laser diode capable of emitting ultraviolet light. The nitride semiconductor element 1 can emit ultraviolet laser light by current injection. The nitride semiconductor element 1 can obtain light emission in a UVB region with wavelengths of from 280 to 320 nm.

[Entire Configuration of Nitride Semiconductor Element]

The configuration of the nitride semiconductor element 1 will be described with reference to FIGS. 1 and 2.

Figure 1:
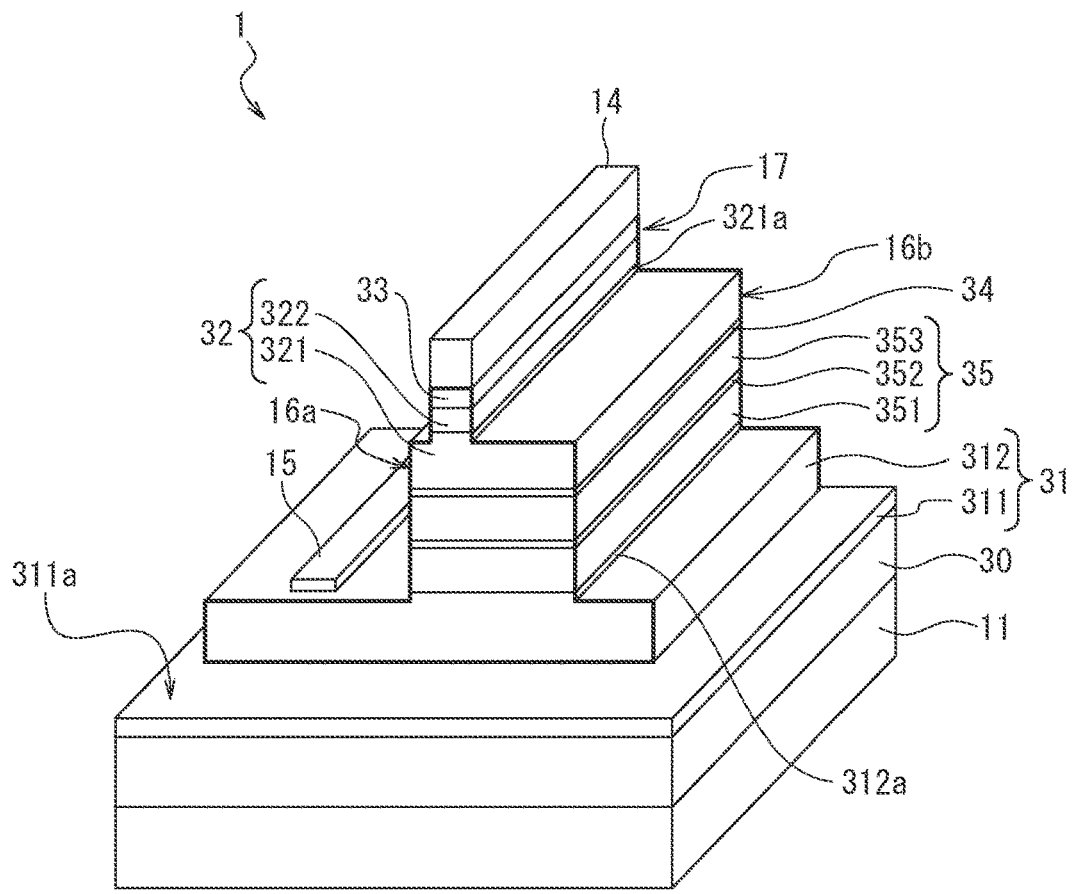
FIG. 1 is a perspective diagram illustrating a configuration example of a nitride semiconductor element according to a first embodiment of the present disclosure.

As illustrated in FIG. 1, the nitride semiconductor element 1 includes a substrate 11, a nitride semiconductor active layer (an example of an active layer) 352 provided above the substrate 11, an electron block layer 34 provided above the nitride semiconductor active layer 352, an AlGaN layer 32 formed on the electron block layer 34, and a second nitride semiconductor layer 33 (an example of a cover layer) covering an upper surface of the AlGaN layer 32. The nitride semiconductor element 1 has a configuration in which an AlN layer (an example of a base layer) 30, a first nitride semiconductor layer 31, a light emitting portion 35 including the nitride semiconductor active layer 352, an electron block layer 34, the AlGaN layer 32, and the second nitride semiconductor layer 33 are stacked in this order on or above the substrate 11. The nitride semiconductor element 1 also includes a first electrode 14 provided in contact with the second nitride semiconductor layer 33 and a second electrode 15 provided in contact with a part of the first nitride semiconductor layer 31.

The following is a detailed description of each portion that forms the nitride semiconductor element 1.

<Electron Block Layer>

The electron block layer 34 is formed above the nitride semiconductor active layer 352. The electron block layer 34 is designed to have a larger bandgap energy than the nitride semiconductor active layer 352. For example, when the nitride semiconductor active layer 352 is formed of AlGaN, the electron block layer 34 can be formed of AlGaN having a higher AlN mixed crystal ratio.

Desirably, the electron block layer 34 is substantially flat in a horizontal direction of the substrate 11. Forming the electron block layer 34 to be substantially flat serves to diffuse carriers (electrons) injected from the second electrode 15 and concentrated locally in a second AlGaN region 322 including protrusions 322a, which will be described later, into a horizontal plane of the electron block layer 34. This is because, due to the large bandgap energy of the electron block layer 34, the electron block layer 34 is a barrier to the diffusion of the carriers.

In the electron block layer 34, the material composition may be constant or may vary in a film thickness direction. However, the material composition is preferably constant to block electrons efficiently and furthermore diffuse the above-mentioned carriers efficiently into the horizontal plane of the electron block layer 34.

<AlGaN Layer>

Figure 2:
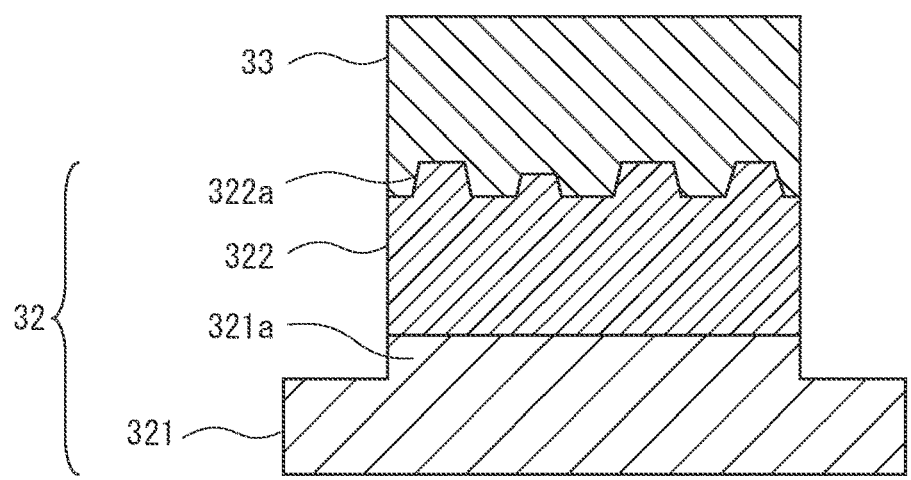
FIG. 2 is a cross-sectional diagram illustrating a configuration example of an AlGaN layer included in the nitride semiconductor element according to the first embodiment of the present disclosure.

FIG. 2 is a cross-sectional diagram illustrating a detailed configuration of the AlGaN layer 32. The AlGaN layer 32 includes the protrusions 322a provided on a surface opposite to the nitride semiconductor active layer 352. The AlGaN layer 32 is formed of AlGaN. The AlGaN layer 32 may be formed of AlGaN having a constant Al composition ratio in a thickness direction or AlGaN having an Al composition ratio decreasing in a direction away from the nitride semiconductor active layer 352. When the electron block layer 34 is formed of AlGaN, the AlN mixed crystal ratio of the AlGaN layer 32 is preferably the same as or smaller than that of the electron block layer 34. Such a design enables efficient transportation of the carriers (electrons) injected from the second electrode 15 to the nitride semiconductor active layer 352.

The nitride semiconductor element 1 including such an AlGaN layer 32 is, for example, an ultraviolet light laser diode that emits ultraviolet B wave.

More specifically, the AlGaN layer 32 is formed of $Al_xGa_{(1-x)}N$, and an Al composition ratio x in the AlGaN layer 32 is, for example, preferably $0<x\leq 0.9$. In other words, the Al composition ratio x in the AlGaN layer 32 may be substantially constant within a range of from 0 to 0.9 in the thickness direction or may vary from 0.9 to almost 0 in the direction away from the nitride semiconductor active layer 352. When the Al composition ratio x in the AlGaN layer 32 varies, the Al composition ratio x may decrease at a constant change rate in the entire region in the thickness direction of the AlGaN layer 32. Alternatively, the Al composition ratio x may be configured to vary in multiple stages by including a region where the Al composition ratio x once becomes constant in a midway portion of the thickness direction of the AlGaN layer 32.

Additionally, as illustrated in FIG. 2, the AlGaN layer 32 may include a first AlGaN region 321 formed of AlGaN and the second AlGaN region 322 including the protrusions 322a. The second AlGaN region 322 is, for example, a region further away from the nitride semiconductor active layer 352 than is the first AlGaN region 321. The first AlGaN region 321 and the second AlGaN region 322 are, for example, regions that are different from each other in average Al composition ratio or change rate of the Al composition ratio.

In the present embodiment, a description will be given of a case where the AlGaN layer 32 includes the first AlGaN region 321 and the second AlGaN region 322.

Each region will be described in detail below.

(First AlGaN Region)

The first AlGaN region 321 is formed of AlGaN. The first AlGaN region 321 is formed on the electron block layer 34, and is a p-type semiconductor. Additionally, the first AlGaN region 321 may be formed of AlGaN having a constant Al composition ratio in a thickness direction or AlGaN having an Al composition ratio decreasing in a direction away from the nitride semiconductor active layer 352.

More specifically, the first AlGaN region 321 is formed of $Al_{x1}Ga_{(1-x1)}N$. An Al composition ratio x1 in the first AlGaN region 321 is, for example, preferably $0.45<x1\leq 0.9$. The Al composition ratio x1 in the first AlGaN region 321 may be substantially constant within a range of from 0.45 to 0.9 in the thickness direction or may vary from 0.9 to 0.45 in the direction away from the nitride semiconductor active layer 352.

As illustrated in FIG. 2, in the present embodiment, a description will be given of the first AlGaN region 321 in which the Al composition ratio x1 decreases from 0.9 to 0.45 in the direction away from the nitride semiconductor active layer 352.

The first AlGaN region 321 may also contain Mg.

Preferably, the first AlGaN region 321 has a thickness of from more than 0 nm to less than 400 nm. When the thickness of the first AlGaN region 321 is less than 400 nm, the first AlGaN region 321 has low resistance, which suppresses increase in the amount of heat generation due to increased drive voltage, so that breakdown of the nitride semiconductor element 1 is unlikely to occur.

When the nitride semiconductor element 1 is a laser diode, the thickness of the first AlGaN region 321 is preferably from 150 nm to less than 400 nm, and more preferably from 200 nm to less than 400 nm. For example, the first AlGaN region 321 has a thickness of 260 nm.

Alternatively, when the nitride semiconductor element 1 is a light emitting diode (LED) or the like, the first AlGaN region 321 may have a thickness of from more than 0 nm to less than 150 nm. Even when the nitride semiconductor element 1 is a laser diode requiring light confinement, high current can be caused to flow while the first AlGaN region 321 is thin. On the other hand, the nitride semiconductor element 1 that is a light emitting diode does not require light confinement. Thus, there can be obtained a favorable element that achieves high current density even when the first AlGaN region 321 is thinner than in the case of a laser diode.

(Second AlGaN Region)

The second AlGaN region 322 is a region further away from the nitride semiconductor active layer 352 than is the first AlGaN region 321, and is a semiconductor having the same conductivity type (i.e., p-type) as that of the first AlGaN region 321 formed of AlGaN. Additionally, the second AlGaN region 322 includes the protrusions 322a on the surface opposite to the nitride semiconductor active layer 352.

The second AlGaN region 322 may be formed of AlGaN having a constant Al composition ratio in a thickness direction or may be configured to have an Al composition ratio decreasing toward tips of the protrusions 322a.

Here, the protrusions 322a are not formed corresponding to an unevenness of any layer located lower than the second AlGaN region 322. Specifically, the thickness of a portion of the second AlGaN region 322 having the protrusions 322a formed thereon is thicker by a height of the protrusions 322a than the thickness of a portion of the second AlGaN region 322 having no protrusions 322a formed thereon. Therefore, even when projections are formed on any layer lower than the second AlGaN region 322, the protrusions 322a are formed at a position different from that of the projections of the lower layer on a plan view or formed in a cycle different from that of the projections of the lower layer.

More specifically, the second AlGaN region 322 is formed of $Al_{x2}Ga_{(1-x2)}N$. Preferably, an Al composition ratio x2 in the second AlGaN region 322 is represented by, for example, $0<x2\leq0.45$. In other words, the Al composition ratio x2 in the second AlGaN region 322 may be substantially constant within a range of from more than 0 to 0.45 in a thickness direction or may vary from 0.45 to almost 0 in the direction away from the nitride semiconductor active layer 352. When the second AlGaN region 322 is formed of AlGaN having an Al composition ratio decreasing toward the tips of the protrusions 322a, a barrier with AlGaN forming the second nitride semiconductor layer 33 can be significantly reduced. This can further reduce a resistance between the second AlGaN region 322 and the second nitride semiconductor layer 33, and Shottky barrier is reduced, which can further improve carrier injection efficiency.

As illustrated in FIG. 2, in the present embodiment, a description will be given of the second AlGaN region 322 in which the Al composition ratio x2 decreases from 0.45 to almost 0 in the direction away from the nitride semiconductor active layer 352.

Preferably, the second AlGaN region 322 is formed to have a lower average Al composition ratio than that of the first AlGaN region 321. This allows for efficient flow of current from the electrode to the active layer.

Preferably, in the second AlGaN region 322, a change rate of the Al composition ratio x2 in the direction toward the tips of the protrusions 322a is larger than a change rate of the Al composition ratio x1 in the first AlGaN region 321.

This allows for efficient flow of current from the second AlGaN region 322 to the first AlGaN region 321, and also allows for suppression of increased internal loss due to light leakage, which will be described later. When the second AlGaN region 322 is formed by a plurality of layers, one of the plurality of layers of the second AlGaN region 322 may have a larger change rate of the Al composition ratio x2 than the change rate of the Al composition ratio x1 in the first AlGaN region 321.

Preferably, in the second AlGaN region 322, the Al composition ratio x2 continuously varies in the thickness direction of the region. In this case, a gradient (i.e., change rate) of the Al composition ratio x2 may be constant or may continuously vary.

Note that more preferably, the Al composition ratio continuously varies in both the first AlGaN region 321 and the second AlGaN region 322. Here, the expression "the Al composition ratio continuously varies in both the first AlGaN region 321 and the second AlGaN region 322" means that the Al composition ratio is consistent in an interface between the first AlGaN region 321 and the second AlGaN region 322 in contact with each other. Additionally, the Al composition ratio in the interface of the contact between the first AlGaN region 321 and the second AlGaN region 322 refers to an Al composition ratio at an intersection between a regression line of the Al composition ratio x1 in the first AlGaN region 321 and a regression line of the Al composition ratio x2 in the second AlGaN region 322.

The AlGaN forming the second AlGaN region 322 may contain a group V element other than N, such as P, As, or Sb, a group III element such as In or B, or an impurity such as C, H, F, O, Si, Cd, Zn, or Be.

The AlGaN forming the second AlGaN region 322 also contains Mg as a p-type semiconductor dopant. The second AlGaN region 322 is a region in which the Al composition ratio x2 continuously decreases, and during a +c-plane growth, polarization induces hole generation in the second AlGaN region 322. In this case, the second AlGaN region 322 may contain Mg as a dopant.

The second AlGaN region 322 may be an undoped layer that does not contain Mg as a dopant. When the second AlGaN region 322 is an undoped layer, impurity-induced light absorption can be suppressed, which can reduce internal loss in the case of a laser diode. Additionally, even in the case of a light emitting diode, suppressing light absorption improves light extraction efficiency, thus enabling light emission efficiency. The second AlGaN region 322 may be in direct contact with the first AlGaN region 321. Alternatively, for example, an AlGaN layer formed of a mixed crystal of AlN and GaN having a constant composition may be included between the first AlGaN region 321 and the second AlGaN region 322.

The second AlGaN region 322 including the protrusions 322a is effective in improving current density. In addition, the second AlGaN region 322 including the protrusions 322a allows for reduced Schottky component and improved carrier injection efficiency.

There are cases where it is difficult to inject holes from the second nitride semiconductor layer 33 serving as the cover layer into the AlGaN layer 32 (the second AlGaN region 322), such as a case where the second nitride semiconductor layer 33 is formed of, for example, GaN. However, including the protrusions 322a in the second AlGaN region 322 can increase a contact area between the second AlGaN region 322 and the second nitride semiconductor layer 33, which can reduce series resistance and pseudo energy barrier. This allows for reduced Schottky component and improved carrier injection efficiency.

Particularly, increasing the height of the protrusions 322a increases contacts between side surfaces of the protrusions 322a and the second nitride semiconductor layer 33. This increases local unevenness of the Al composition in the side surfaces of the protrusions 322a. In other words, it facilitates formation of points where current flows easily from an upper surface of the second AlGaN region 322 and the side surfaces of the protrusions 322a. As a result, current flows easily between the second nitride semiconductor layer 33 and the second AlGaN region 322. In the second AlGaN region not including the protrusions 322a, the surface thereof facing the second nitride semiconductor layer 33 side is even, and the unevenness of the Al composition is small, so that there are less micro local points where current flows easily.

Furthermore, including the protrusions 322a in the second AlGaN region 322 relaxes distortion, which suppresses the occurrence of cracks in the second AlGaN region 322.

Additionally, the protrusions 322a have preferably a frustum shape. Nitride forming the protrusions 322a is hexagonal crystal. Therefore, when forming the protrusions 322a on the second AlGaN region 322 by crystal growth, crystal having a substantially hexagonal plane shape grows. When the protrusions 322a have a frustum shape, such as, for example, a hexagonal frustum shape, current concentration at the tips of the protrusions 322a can be suppressed. This makes it unlikely to cause destruction of the protrusions 322a due to current concentration at the tips of the protrusions 322a. As a result, it is possible to suppress top parts of the protrusions 322a from being easily destroyed due to current concentration on the top parts thereof, which occurs, for example, when conical shaped protruding portions are provided.

The protrusions 322a has a height of preferably 7 nm or more, and more preferably 50 nm or more. When the height of the protrusions 322a is 7 nm or more, a sufficient current density required for oscillation of a laser diode that emits ultraviolet light can be obtained, and a high current density is achieved.

The second AlGaN region 322 has a thickness of from more than 0 nm to less than 130 nm. Here, in the present disclosure, the thickness of the second AlGaN region 322 refers to a thickness up to the upper surface of the second AlGaN region 322 excluding the protrusions 322a from a boundary between the second AlGaN region 322 and the first AlGaN region 321. When the thickness of the second AlGaN region 322 is less than 130 nm, it is preferable because the nitride semiconductor element 1 oscillates favorably. The second AlGaN region 322 is formed with a thickness of, for example, 30 nm.

The first AlGaN region 321 and the second AlGaN region 322 are formed by growing a thin film using, for example, a metalorganic vapor phase epitaxy apparatus (MOVPE apparatus). As for the AlGaN layer 32, AlGaN is grown by continuously increasing the flow rate of TMG (trimethylgallium) and continuously reducing the flow rate of TMA (trimethylaluminum) as raw material gases while simultaneously supplying ammonium gas. As a result, there can be produced the AlGaN layer 32 with the varying Al composition ratio of AlGaN. In this case, Mg can be added as an impurity in AlGaN by supplying $Cp_2Mg$ (cyclopentadienyl magnesium) simultaneously with the ammonium gas.

The following method can be used as a method for forming an uneven structure of the second AlGaN region 322 provided with the protrusions 322a.

After forming the first AlGaN region 321, a thin-film is grown again using a $SiO_2$ mask with openings for a growing region of the protrusions 322a, thereby enabling the formation of the protrusions 322a. After forming the protrusions 322a, the above-mentioned mask is removed with a chemical solution such as hydrofluoric acid, as a result of which the uneven structure of the surface of the second AlGaN region 322 can be formed.

Additionally, as an alternative to the above-described method, the protrusions 322a may be formed by continuously growing the thin films of the first AlGaN region 321 and the second AlGaN region 322, then masking the region for forming the protrusions 322a with resist, and then etching the surface of the second AlGaN region 322.

<Second Nitride Semiconductor Layer>

The second nitride semiconductor layer 33 is a region further away from the nitride semiconductor active layer 352 than is the second AlGaN region 322, and is a cover layer covering the entire surfaces of the protrusions 322a of the second AlGaN region 322. The second nitride semiconductor layer 33 is formed of AlGaN or GaN having a lower Al composition ratio than that in the second AlGaN region 322. Specifically, the second nitride semiconductor layer 33 is formed of $Al_{x3}Ga_{(1-x3)}N$ (0≤x3<x2).

When a top layer of the second nitride semiconductor layer 33 is formed of p-type GaN (p-GaN), a contact resistance with the first electrode 14 arranged on the second nitride semiconductor layer 33 can be reduced, and a wavelength range of ultraviolet light at which the nitride semiconductor element 1 can operate is widened. This is because with the use of p-type GaN as the second nitride semiconductor layer 33, the Al composition ratio of the AlGaN in the second AlGaN region 322 can be designed widely.

The second nitride semiconductor layer 33 may have a configuration in which a plurality of layers are stacked. In this case, the above-mentioned Al composition ratio of the second nitride semiconductor layer 33 indicates the Al composition ratio of a top surface layer, i.e., a surface in contact with the first electrode 14.

The second nitride semiconductor layer 33 is a p-type semiconductor layer, and AlGaN or GaN is doped with Mg at a concentration of, for example, $3\times10^{19}$ $cm^{-3}$ to make the second nitride semiconductor layer 33 p-type.

The concentration of the dopant may be constant or non-uniform in a direction perpendicular to the substrate 11. The dopant concentration may be constant or non-uniform in an in-plane direction of the substrate 11.

The second nitride semiconductor layer 33 may have a structure in which the Al composition ratio of the AlGaN is graded. For example, the second nitride semiconductor layer 33 may have a layer structure in which the Al composition ratio of the AlGaN decreases continuously or stepwise from a minimum value of the Al composition ratio in the AlGaN layer 32. When the second nitride semiconductor layer 33 has the layer structure, the second nitride semiconductor layer 33 may be an undoped layer.

The second nitride semiconductor layer 33 may have a stacking structure that further includes a layer having a high doping concentration as the top layer. The second nitride semiconductor layer 33 may have a stacking structure including two or more layers. In this case, preferably, the Al composition ratio is made smaller toward an upper layer in order to efficiently transport carriers to the nitride semiconductor active layer 352.

The second nitride semiconductor layer 33 has a thickness of preferably from more than 10 nm to less than 10 μm, more preferably from 200 nm to less than 10 μm, and still more preferably from 500 nm to 5 μm. When the thickness of the second nitride semiconductor layer 33 is more than 10 nm, the unevenness of the surface of the second AlGaN region 322 formed by the protrusions 322a can be relatively uniformly covered, thereby improving adhesion between the AlGaN layer 32 and the second nitride semiconductor layer 33 provided on the upper surface of the AlGaN layer 32. Specifically, it is possible to suppress formation of a void and a region uncovered by the second nitride semiconductor layer 33 between the protrusions 322a on an interface between the AlGaN layer 32 and the second nitride semiconductor layer 33. This can improve current density. In addition, when holes are injected from the first electrode 14, current concentration onto the tips of the protrusions 322a can be suppressed, and current can be uniformly injected from the upper surface of the second AlGaN region 322 (the surface facing the second nitride semiconductor layer 33). Additionally, when the thickness of the second nitride semiconductor layer 33 is more than 0 nm, the AlGaN layer 32 and the first electrode 14 are connected with low resistance via the second nitride semiconductor layer 33.

Additionally, when the thickness of the second nitride semiconductor layer 33 is less than 10 μm, cracking is unlikely to occur during formation of the AlGaN layer 32, which is therefore preferable.

Furthermore, having the thickness of the second nitride semiconductor layer 33 within the above range can suppress three-dimensional growth due to lattice relaxation during growth of the second nitride semiconductor layer 33, thereby enabling flattening of the surface of the second nitride semiconductor layer 33. This can stabilize contactability between the second nitride semiconductor layer 33 and the first electrode 14, whereby the nitride semiconductor element 1 can achieve high reproducibility and low drive voltage.

<Ridge Semiconductor Layer>

A ridge semiconductor layer 17 is formed by including a part of the AlGaN layer 32. The ridge semiconductor layer 17 includes a protruding region 321a formed on the first AlGaN region 321, the second AlGaN region 322 including the protrusions 322a, and the second nitride semiconductor layer 33. Forming the ridge semiconductor layer 17 at a partial portion of the first AlGaN region 321 suppresses the carriers (holes) injected from the first electrode 14 from diffusing in the horizontal direction of the substrate 11 in the ridge semiconductor layer 17. This controls light emission by the nitride semiconductor active layer 352 to a region located below the ridge semiconductor layer 17 (i.e., a region located below the protruding region 321a of the first AlGaN region 321). As a result, the nitride semiconductor element 1 can achieve high current density, allowing for reduced laser oscillation threshold.

As described above, roles of the ridge semiconductor layer 17 are the current concentration and the confinement of light in the horizontal direction of the substrate 11. Therefore, the ridge semiconductor layer 17 does not necessarily have to be formed only at the partial portion of the first AlGaN region 321. The ridge semiconductor layer 17 may include the light emitting portion 35, and may include the entire first AlGaN region 321. Alternatively, the ridge semiconductor layer 17 does not have to be formed. When the ridge semiconductor layer 17 is not formed, the second AlGaN region 322 is formed with the same area as that of the first AlGaN region 321. Additionally, the first electrode 14 (details thereof will be described later) may be designed to have appropriate width and length such that the amount of current injection is suppressed.

As described above, the ridge semiconductor layer 17 is biased to the second electrode 15 side. Arranging the ridge semiconductor layer 17 close to the second electrode 15 shortens a path of current flowing through the nitride semiconductor element 1, which can therefore reduce a resistance value of the current path formed in the nitride semiconductor element 1. This can achieve reduced drive voltage of the nitride semiconductor element 1. However, it is preferable that the protruding region 321a and the ridge semiconductor layer 17 are 1 µm or more away from mesa edges (edges of a region of the first AlGaN region 321 excluding the protruding region 321a) from the viewpoint of lithographic reproducibility. The protruding region 321a and the ridge semiconductor layer 17 may be formed to be biased to a centrally located side.

<Substrate>

Examples of the substrate 11 include Si, SiC, MgO, $Ga_2O_3$, $Al_2O_3$, ZnO, GaN, InN, AlN, and mixed crystals thereof. The substrate 11 serves to support upper layer thin films, improve crystallinity, and furthermore dissipate heat to the outside. Therefore, as the substrate 11, it is preferable to use an AlN substrate capable of growing AlGaN with high quality and having high thermal conductivity. A growth surface of the substrate is favorably commonly used+c-plane AlN because of low cost, but it may be a –c-plane AlN substrate, a semi-polar plane substrate, or a non-polar plane substrate. From the viewpoint of increasing the effect of polarization doping, +c-plane AlN is preferable.

The substrate 11 preferably has a quadrangular thin plate-like shape in terms of assembly, but is not limited to such a configuration. Additionally, the off-angle of the substrate 11 is preferably larger than 0 degrees and smaller than 2 degrees from the viewpoint of growing a high quality crystal.

The thickness of the substrate 11 is not particularly limited as long as it is intended to stack an AlGaN layer on an upper layer thereof, but a thickness of from 1 µm to 50 µm is preferable. In addition, although the crystal quality of the substrate 11 is not particularly limited, threading dislocation density is preferably $1 \times 10^9$ $cm^2$ or less, and more preferably $1 \times 10^8$ $cm^{-2}$ or less. This allows for formation of a thin film element having high light emission efficiency above the substrate 11.

<AlN Layer>

The AlN layer 30 is formed further away from the nitride semiconductor active layer 352 than is the first nitride semiconductor layer 31, and is formed on the entire surface of the substrate 11. In the present disclosure, including the AlN layer 30 in the nitride semiconductor element 1 facilitates formation of the protrusions 322a on the upper surface of the second AlGaN region 322 of the AlGaN layer 32. In other words, the AlN layer also serves as a base layer for forming the protrusions 322a on the upper surface of the second AlGaN region 322.

The AlN layer 30 is small in lattice constant difference and thermal expansion coefficient difference from the first nitride semiconductor layer 31, and can grow a less defective nitride semiconductor layer on the AlN layer 30. The AlN layer 30 also can grow the first nitride semiconductor layer 31 under compressive stress, and can suppress the occurrence of cracks in the first nitride semiconductor layer 31.

Therefore, even when the substrate 11 is formed of a nitride semiconductor such as AlN or AlGaN, a less defective nitride semiconductor layer can be grown above the substrate 11 via the AlN layer 30.

An impurity such as C, Si, Fe, or Mg may be mixed in the AlN layer 30.

When AlN is used as a material for forming the substrate 11, the AlN layer 30 and the substrate 11 will be formed of the same material, which makes unclear the boundary between the AlN layer 30 and the substrate 11. In the present embodiment, it is considered that when the substrate 11 is formed of AlN, the substrate 11 forms the substrate 11 and the AlN layer 30.

The AlN layer 30 has a thickness of, for example, several µm (for example, 1.6 µm), but the value is merely illustrative. Specifically, the thickness of the AlN layer 30 is preferably thicker than 10 nm and thinner than 10 µm. When the thickness of the AlN layer 30 is thicker than 10 nm, the crystallinity of AlN increases. Additionally, when the thickness of the AlN layer 30 is thinner than 10 µm, cracking is unlikely to occur in the AlN layer 30 formed by crystal growth on an entire wafer surface. Furthermore, more preferably, the AlN layer 30 is thicker than 50 nm and thinner than 5 µm. When the thickness of the AlN layer 30 is thicker than 50 nm, highly crystalline AlN can be produced with high reproducibility, and when the thickness of the AlN layer 30 is thinner than 5 µm, the occurrence of cracking in the AlN layer 30 is more unlikely to occur.

The AlN layer 30 is formed thinner than the first nitride semiconductor layer 31, but this is merely illustrative. When the AlN layer 30 is thinner than the first nitride semiconductor layer 31, the first nitride semiconductor layer 31 can be made as thick as possible within a range where no cracks occur. In this case, the horizontal resistance of a thin-film layer stacked as the first nitride semiconductor layer 31 is reduced, whereby the nitride semiconductor element 1 can be driven at low voltage. Achieving low voltage driving of the nitride semiconductor element 1 can further suppress breakdown thereof when driven at high current density due to heat generation.

Note that the AlN layer 30 does not necessarily have to be provided. For example, even by forming in order the first nitride semiconductor layer 31, the light emitting portion 35, the electron block layer 34, and the AlGaN layer 32 on the substrate 11, the protrusions 322a can be formed on the AlGaN layer 32.

<First Nitride Semiconductor Layer>

The first nitride semiconductor layer 31 is a layer provided on a surface of the light emitting portion 35 including the nitride semiconductor active layer 352 on a side opposite to the AlGaN layer 32. The first nitride semiconductor layer 31 includes a first stacked portion 311 arranged above the substrate 11 and a second stacked portion 312 stacked on the first stacked portion 311. The second stacked portion 312 includes a protruding region 312a formed on a part of a surface of the second stacked portion 312. The second stacked portion 312 is arranged on a part of an upper surface 311a of the first stacked portion 311. Therefore, the upper surface 311a of the first stacked portion 311 includes a region formed without the second stacked portion 312 and a region formed with the second stacked portion 312. The region formed without the second stacked portion 312 on the upper surface 311a of the first stacked portion 311 is provided with the second electrode 15 connected with the first stacked portion 311.

Note that the second stacked portion 312 may be stacked on the entire part of the upper surface 311a of the first stacked portion 311.

The first stacked portion 311 and the second stacked portion 312 are both formed of AlGaN. The Al composition ratio of each of the first stacked portion 311 and the second stacked portion 312 may be the same or different. The Al composition ratio of the first nitride semiconductor layer 31 can be identified by energy dispersive X-ray spectroscopy (EDX) of a cross-sectional structure. The cross section of the first nitride semiconductor layer 31 can be observed by exposing the cross section along the a-plane of the AlGaN using a focused ion beam (FIB) device. A transmission electron microscope is used as a method for observing the cross section. The observation magnification varies according to the thickness of a layer to be measured, and it is preferable to set the magnification so that scale bar levels of first nitride semiconductor layers 31 having different thicknesses are the same as each other. For example, when observing a first nitride semiconductor layer 31 having a thickness of 100 nm, the magnification is set to preferably approximately 1000 times. Additionally, when the magnification to observe the first nitride semiconductor layer 31 having the thickness of 100 nm is approximately 1000 times, it is preferable to observe a first nitride semiconductor layer 31 having a thickness of 1 μm at a magnification of approximately 10 times. This allows for observation of the first nitride semiconductor layers 31 different in thickness at the same scale level.

The Al composition ratio can be defined as a ratio of the number of moles of Al to a sum of the numbers of moles of Al and Ga, and specifically can be defined using values of the numbers of moles of Al and Ga analyzed and quantified from the EDX.

The first stacked portion 311 is formed of, for example, $Al_{x5}Ga_{(1-x5)}N$ (0<x5<1). The first stacked portion 311 may contain, for example, B or In other than Al and Ga as group III elements in AlGaN. However, defect formation and change in durability occur in a B or In containing region, so that it is preferable to contain no group III elements other than Al and Ga.

Furthermore, the first stacked portion 311 may contain a group V element other than N, such as P, As, or Sb or an impurity such as C, H, F, 0, Mg, or Si, in addition to AlGaN.

The second stacked portion 312 is formed of, for example, $Al_{x6}Ga_{(1-x6)}N$ (0<x6<1). An Al composition ratio x6 of the AlGaN forming the second stacked portion 312 may be the same as or smaller than an Al composition ratio x5 in the upper surface 311a of the first stacked portion 311. This can suppress the occurrence of a defect in a stacked interface between the first stacked portion 311 and the second stacked portion 312.

Additionally, the second stacked portion 312 may contain a group V element other than N, such as P, As, or Sb, a group III element such as In or B, or an impurity such as C, H, F, O, Si, Cd, Zn, or Be, in addition to AlGaN.

In the present disclosure, the first stacked portion 311 and the second stacked portion 312 are n-type semiconductors. The first stacked portion 311 and the second stacked portion 312 are made n-type by doping AlGaN with, for example, Si at a concentration of $1\times10^{19}$ cm$^{-3}$. Impurity concentration may be uniform or non-uniform throughout the layer, may be non-uniform only in the thickness direction, or may be non-uniform only in the horizontal direction of the substrate.

The first stacked portion 311 and the second electrode 15 may be in direct contact with each other or may be connected via a different layer, like a tunnel junction. When the first nitride semiconductor layer 31 formed of an n-type semiconductor is connected with the second electrode 15 by a tunnel-junction, there is provided a p-type semiconductor between the first nitride semiconductor layer 31 and the second electrode 15. Therefore, the second electrode 15 is preferably formed of a material capable of forming an ohmic contact with the p-type semiconductor. Preferably, the second electrode 15 is, for example, a stacked electrode of Ni and Au or an electrode formed of an alloyed metal thereof.

The second stacked portion 312 is an n-type semiconductor from the viewpoint of forming a PN diode with the AlGaN layer 32. The AlGaN layer 32 uses the AlGaN in which the Al composition ratio x decreases in the thickness direction of the AlGaN layer 32. Therefore, for example, when +c-plane sapphire is used as the substrate 11, the AlGaN layer 32 becomes a p-type semiconductor due to polarization.

The thickness of the first stacked portion 311 is not particularly limited, but for example, preferably from 100 nm to 10 μm. When the thickness of the first stacked portion 311 is 100 nm or more, resistance of the first stacked portion 311 is reduced. When the thickness of the first stacked portion 311 is 10 μm or less, the occurrence of cracking during formation of the first stacked portion 311 is suppressed.

The thickness of the second stacked portion 312 is not particularly limited, but, for example, preferably from 100 nm to 10 μm. When the thickness of the second stacked portion 312 is 100 nm or more, resistance of the second stacked portion 312 is reduced. When the thickness of the second stacked portion 312 is 10 μm or less, the occurrence of cracking during formation of the second stacked portion 312 is suppressed.

<Light Emitting Portion>

The light emitting portion 35 includes the nitride semiconductor active layer 352, a lower guide layer 351 provided on one surface of the nitride semiconductor active layer 352, and an upper guide layer 353 provided on an other surface of the nitride semiconductor active layer 352. The lower guide layer 351 is provided between the first nitride semiconductor layer 31 and the nitride semiconductor active layer 352. The upper guide layer 353 is provided between the nitride semiconductor active layer 352 and the AlGaN layer 32.

(Lower Guide Layer)

The lower guide layer 351 is formed on the second stacked portion 312 of the first nitride semiconductor layer 31. The lower guide layer 351 has a refractive index difference from that of the second stacked portion 312 in order to confine light emitted by the nitride semiconductor active layer 352 in the light emitting portion 35. The lower guide layer 351 is formed of, for example, a mixed crystal of AlN and GaN. Specifically, the lower guide layer 351 is formed of $Al_{x7}Ga_{(1-x7)}N$ (0<x7<1).

Additionally, the material for forming the lower guide layer 351 may contain a group V element other than N, such as P, As, or Sb, a group III element such as In or B, or an impurity such as C, H, F, O, Si, Cd, Zn, or Be.

An Al composition ratio x7 in the lower guide layer 351 can be identified by energy dispersive X-ray spectroscopy (EDX) of a cross-sectional structure. The Al composition ratio x7 can be defined as the ratio of the number of moles of Al to the sum of the numbers of moles of Al and Ga, and specifically can be defined using the values of the numbers of moles of Al and Ga analyzed and quantified from the EDX. The Al composition ratio x7 in the lower guide layer 351 may be smaller than the Al composition ratio x6 in the second stacked portion 312. As a result, the lower guide layer 351 has a higher refractive index than that of the second stacked portion 312, which allows light emitted by the nitride semiconductor active layer 352 to be confined in the light emitting portion 35.

The lower guide layer 351 is an n-type semiconductor. When Si as a dopant is doped at a concentration of $1\times10^{19}$ $cm^{-3}$ into AlGaN, the lower guide layer 351 is made n-type. The lower guide layer 351 may be an undoped layer that does not contain Si and Mg as dopants.

(Nitride Semiconductor Active Layer)

The nitride semiconductor active layer 352 is a light emitting layer from which light emission of the nitride semiconductor element 1 can be obtained.

The nitride semiconductor active layer 352 is formed of, for example, AlN, GaN, and a mixed crystal thereof. More specifically, the nitride semiconductor active layer 352 is formed of, for example, $Al_{x8}Ga_{(1-x8)}N$ (0≤x8≤1). An Al composition ratio x8 in the nitride semiconductor active layer 352 is preferably smaller than the Al composition ratio x7 in the lower guide layer 351. This allows for efficient confinement of carriers injected from the first electrode 14 and the second electrode 15 in the light emitting portion 35.

The nitride semiconductor active layer 352 may contain a group V element other than N, such as P, As, or Sb, a group III element such as In or B, or an impurity such as C, H, F, O, Si, Cd, Zn, or Be.

When the nitride semiconductor active layer 352 is an n-type semiconductor, Si as a dopant is doped at a concentration of $1\times10^{19}$ $cm^3$ in AlGaN to make the nitride semiconductor active layer 352 n-type. When the nitride semiconductor active layer 352 is a p-type semiconductor, Mg as a dopant is doped at a concentration of $3\times10^{19}$ $cm^{-3}$ in AlGaN to make the nitride semiconductor active layer 352 p-type. The nitride semiconductor active layer 352 may be an undoped layer that does not contain Si and Mg as dopants.

The nitride semiconductor active layer 352 includes an unillustrated well layer and a barrier layer provided adjacent to the well layer. The nitride semiconductor active layer 352 may have a multiple quantum well (MQW) structure in which well layers and barrier layers are alternately stacked one by one. When the nitride semiconductor element 1 includes the nitride semiconductor active layer 352 that has a single quantum well structure, carrier density in one well layer can be increased. On the other hand, the nitride semiconductor active layer 352 may have, for example, a double quantum well structure including "barrier layer/well layer/barrier layer/well layer/barrier layer" or a triple or more quantum well structure. When the nitride semiconductor element 1 includes the nitride semiconductor active layer 352 having a multiple quantum well structure, light emission efficiency and light emission intensity of the nitride semiconductor active layer 352 can be improved. In the case of the double quantum well structure, the thickness of the well layers may be, for example, 4 nm, the thickness of the barrier layers may be, for example, 8 nm, and the thickness of the nitride semiconductor active layer 352 may be 32 nm.

The Al composition ratio in the well layer is smaller than the Al composition ratio in each of the lower guide layer 351 and the upper guide layer 353. Additionally, the Al composition ratio in the well layer is smaller than the Al composition ratio in the barrier layer. In addition, the Al composition ratio in the barrier layer may be the same as or different from the Al composition ratio in each of the lower guide layer 351 and the upper guide layer 353. Note that an average Al composition ratio between the well layer and the barrier layer is an Al composition ratio in the entire nitride semiconductor active layer 352. The Al composition ratios in the well layer and the barrier layer can be identified by energy dispersive X-ray spectroscopy (EDX) of a cross-sectional structure. The Al composition ratios can be each defined as the ratio of the number of moles of Al to the sum of the numbers of moles of Al and Ga, and specifically can be each defined using the values of the numbers of moles of Al and Ga analyzed and quantified from the EDX.

(Upper Guide Layer)

The upper guide layer 353 is formed on the nitride semiconductor active layer 352. The upper guide layer 353 has a refractive index difference from that of the second nitride semiconductor layer 33 in order to confine light emitted by the nitride semiconductor active layer 352 in the light emitting portion 35. The upper guide layer 353 is formed of, for example, AlN, GaN, and a mixed crystal thereof. Specifically, the upper guide layer 353 is formed of $Al_{x9}Ga_{(1-x9)}N$ (0≤x9≤1).

Additionally, the material for forming the upper guide layer 353 may contain a group V element other than N, such as P, As, or Sb, a group III element such as In or B, or an impurity such as C, H, F, O, Si, Cd, Zn, or Be.

An Al composition ratio X9 in the upper guide layer 353 can be identified by energy dispersive X-ray spectroscopy (EDX) of a cross-sectional structure. The Al composition ratio x9 can be defined as the ratio of the number of moles of Al to the sum of the numbers of moles of Al and Ga, and specifically can be defined using the values of the numbers of moles of Al and Ga analyzed and quantified from the EDX. The Al composition ratio x9 in the upper guide layer 353 may be larger than the Al composition ratio in the well layer. This allows for carrier confinement in the nitride semiconductor active layer 352.

The upper guide layer 353 may be either an n-type semiconductor or a p-type semiconductor. When the upper guide layer 353 is an n-type semiconductor, for example, Si is doped at a concentration of $1\times10^{19}$ $cm^{-3}$ in AlGaN to make the upper guide layer 353 n-type. When the upper guide layer 353 is a p-type semiconductor, for example, Mg is doped at a concentration of $3\times10^{19}$ cm$^{-3}$ in AlGaN to make the upper guide layer 353 p-type. The upper guide layer 353 may be an undoped layer.

<Electron Block Layer>

The electron block layer 34 is provided between the light emitting portion 35 and the AlGaN layer 32. The electron block layer 34 can reflect electrons that have been poured in from the first nitride semiconductor layer 31 side and have not been injected into the nitride semiconductor active layer 352, and can inject the electrons into the nitride semiconductor active layer 352. The electrons that have not been injected into the nitride semiconductor active layer 352 are, for example, electrons that are not injected into the nitride semiconductor active layer 352 and flow to the AlGaN layer 32 side when the AlGaN layer 32 has a low hole concentration. When the electrons flow to the AlGaN layer 32 side, electron injection efficiency into the nitride semiconductor active layer 352 is lowered, which makes it difficult to sufficiently improve the light emission efficiency. Providing the electron block layer 34 can improve the electron injection efficiency into the nitride semiconductor active layer 352, enabling improvement in the light emission efficiency.

The electron block layer 34 is formed of, for example, AlGaN. More specifically, the electron block layer 34 is formed of $Al_{x4}Ga_{(1-x4)}N$. An Al composition ratio x4 in the electron block layer 34 is, for example, preferably equal to or more than the Al composition ratio x1. The electron block layer 34 may be a p-type semiconductor, and may be injected with Mg. Mg is injected at an impurity concentration of, for example, $1\times10^{18}$ cm$^{-3}$ in the electron block layer 34. This makes the electron block layer 34 p-type to form a p-type semiconductor. Mg does not have to be added into the electron block layer 34. When Mg is not added into the electron block layer 34, conductivity of the electron block layer 34 is lowered. However, particularly, in the case of a laser diode, an increase in internal loss due to absorption can be suppressed, so that a threshold current density Jth can be reduced.

The electron block layer 34 is required to have as high a barrier height as possible from the viewpoint of blocking electrons. However, setting the barrier height too high increases element resistance, which increases the drive voltage of the nitride semiconductor element 1, and reduces a maximum current density reachable without causing breakdown of the nitride semiconductor element 1. Therefore, preferably, the Al composition ratio in the electron block layer 34 is higher than the Al composition ratio in the nitride semiconductor active layer 352 by at least 0.3 and less than 0.55. When the Al composition ratio in the electron block layer 34 is higher than the Al composition ratio in the nitride semiconductor active layer 352 by 0.3 or more, element continuity is favorably maintained. Additionally, when the Al composition ratio in the electron block layer 34 is higher than the Al composition ratio in the nitride semiconductor active layer 352 by less than 0.55, an increase in the element resistance is suppressed.

The thickness of the electron block layer 34 is preferably from 0 nm to 50 nm, more preferably from 0 nm to 30 nm, and still more preferably from 2 nm to 20 nm. In other words, the electron block layer 34 does not have to be provided. When the thickness of the electron block layer 34 is 50 nm or less, the nitride semiconductor element 1 has low element resistance and can be driven at low voltage. Furthermore, the smaller the thickness of the electron block layer 34, the lower the element resistance of the nitride semiconductor element 1 can be. Thus, the smaller the thickness of the electron block layer 34, the more preferable it is. In addition, when the thickness of the electron block layer 34 is 2 nm or more, it is preferable from the viewpoint of improving light emission output because internal efficiency can be improved by exerting the effect of blocking electrons.

The electron block layer 34 may be arranged between the nitride semiconductor active layer 352 and the upper guide layer 353. Alternatively, the electron block layer 34 may be arranged in the lower guide layer 351 so as to divide the lower guide layer 351. Alternatively, the electron block layer 34 may be arranged between the lower guide layer 351 and the nitride semiconductor active layer 352. The electron block layer 34 may be formed by a plurality of layers. The electron block layer 34 may be formed with a single Al composition or may have a superlattice structure in which high Al composition and low Al composition are repeated.

<First Electrode>

The first electrode 14 is formed on the ridge semiconductor layer 17, i.e., on the second nitride semiconductor layer 33, which is a top layer of the ridge semiconductor layer 17.

The first electrode 14 is a p-type electrode. When used to inject holes into a nitride semiconductor light emitting element, the first electrode 14 is formed of a p-type electrode material for a typical nitride semiconductor light emitting element. For example, the first electrode 14 is formed of Ni, Au, Pt, Ag, Rh, Pd, Cu, or any alloy thereof, ITO, or the like, and particularly preferably formed of Ni, Au, or an alloy thereof, or ITO. This is because a contact resistance between the first electrode 14 and the ridge semiconductor layer 17 is reduced.

The first electrode 14 may include a pad electrode (a first pad electrode) on an upper part thereof in order to evenly diffuse current over the entire region of the first electrode 14. The pad electrode is formed of, for example, Au, Al, Cu, Ag, W, or the like, and preferably formed of Au from the viewpoint of conductivity. Additionally, the first electrode 14 may have a structure in which a first contact electrode formed of, for example, an alloy of Ni and Au is formed on the ridge semiconductor layer 17, and the first pad electrode formed of Au is formed on a second contact electrode.

The first electrode 14 is formed with a thickness of, for example, 240 nm.

In the case of a laser diode, the first electrode 14 may have a rectangular shape with a short side length of less than 10 μm and a long side length of 1000 μm or less, and may be stacked on the second nitride semiconductor layer 33. In the case of a light emitting diode, various shapes are assumed, but, for example, a 50 μm×200 μm rectangular shape or the like is assumed. A surface of the first electrode 14 facing the ridge semiconductor layer 17 is substantially the same in shape with the ridge semiconductor layer 17. Since the contact surfaces of the first electrode 14 and the ridge semiconductor layer 17 have the same shape as each other, the carriers (holes) injected from the first electrode 14 are suppressed from diffusing in the horizontal direction of the substrate 11 in the ridge semiconductor layer 17, so that light emission by the nitride semiconductor active layer 352 can be controlled.

<Second Electrode>

The second electrode 15 is formed on the second stacked portion 312 of the first nitride semiconductor layer 31.

The second electrode 15 is an n-type electrode. When used to inject electrons into the first nitride semiconductor layer 31, the second electrode 15 is formed of an n-type electrode material for a typical nitride semiconductor light emitting element. For example, the second electrode 15 is formed of Ti, Al, Ni, Au, Cr, V, Zr, Hf, Nb, Ta, Mo, W, or any alloy thereof, ITO, or the like.

The second electrode 15 may include a pad electrode (a second pad electrode) on an upper part thereof in order to evenly diffuse current over the entire region of the second electrode 15. The pad electrode can be the same in material and configuration as the pad electrode of the first electrode 14.

The second electrode 15 is formed with a thickness of, for example, 60 nm. While the second electrode 15 in the present disclosure is formed with a thickness different from that of the first electrode 14, the second electrode 15 may be the same in thickness as the first electrode 14.

(Resonator Surface) When the nitride semiconductor element 1 is applied to a laser diode, it is necessary to form a resonator surface. A resonator surface 16a is formed by the same plane formed by respective one side surfaces of the second stacked portion 312 of the first nitride semiconductor layer 31, the light emitting portion 35, the electron block layer 34, the AlGaN layer 32, and the second nitride semiconductor layer 33. The resonator surface 16a is a surface whose contour is illustrated by a thick line in FIG. 1.

Additionally, a backside resonator surface 16b is a side surface opposing the resonator surface 16a, and formed by the same plane formed by respective one side surfaces of the second stacked portion 312 of the first nitride semiconductor layer 31, the light emitting portion 35, the electron block layer 34, the AlGaN layer 32, and the second nitride semiconductor layer 33. The backside resonator surface 16b is a surface whose partial contour is illustrated by a thick line in FIG. 1.

The resonator surface 16a and the backside resonator surface 16b are provided to reflect light emitted from the light emitting portion 35. The resonator surface 16a and the backside resonator surface 16b are paired together to confine the light reflected by the resonator surface 16a and the backside resonator surface 16b in the light emitting portion 35. The resonator surface 16a is, for example, a light emitting side of the nitride semiconductor element 1. In order to reflect light emitted from the light emitting portion 35 on the resonator surface 16a and the backside resonator surface 16b, the resonator surface 16a and the backside resonator surface 16b may be perpendicular and flat with respect to a contact surface between the light emitting portion 35 and the electron block layer 34. However, the resonator surface 16a and the backside resonator surface 16b may entirely or partially have an inclined portion or an uneven portion.

Surfaces of the resonator surface 16a and the backside resonator surface 16b may be formed with an insulating protective film such as a dielectric multilayer film and a reflective film. Specifically, the insulating protective film may be formed of $SiO_2$, and besides, may be formed of $Al_2O_3$, SiN, $SnO_2$, ZrO, $HfO_2$, or the like. Additionally, the insulating protective film may have a structure in which the materials are laminated. The insulating protective film may be formed on surfaces of both the resonator surface 16a serving as the light emitting side of the nitride semiconductor element 1 and the backside resonator surface 16b serving not as the light emitting side but as a light reflecting side. The insulating protective film formed on the resonator surface 16a on the light emitting side and the insulating protective film formed on the backside resonator surface 16b on the light reflecting side may be the same or different in structure.

<Effects of First Embodiment>

The nitride semiconductor element according to the first embodiment has the following effects:

(1) The nitride semiconductor element includes the AlGaN layer formed above the nitride semiconductor active layer and including the first AlGaN region and the second AlGaN region including the protrusions on the upper surface thereof, and the second nitride semiconductor layer as the cover layer covering the entire surfaces of the protrusions of the second AlGaN region.

As a result, in the AlGaN layer, the contact area between the second AlGaN region and the second nitride semiconductor layer increases, which improves current density.

(2) The nitride semiconductor element includes the second AlGaN region formed of the AlGaN having an Al composition ratio decreasing toward the tips of the protrusions.

As a result, in the nitride semiconductor element, the barrier between the second AlGaN region and the second nitride semiconductor layer is significantly reduced, which reduces the resistance between the second AlGaN region and the second nitride semiconductor layer, as well as the Schottky barrier is reduced, resulting in improved carrier injection efficiency.

(3) The nitride semiconductor element preferably includes the second AlGaN region including the protrusions having a frustum shape.

This can suppress local current concentration at the tips of the protrusions when electrons are injected from the first electrode, thus allowing for uniform current injection from the upper surface of the second AlGaN region.

(4) The nitride semiconductor element preferably includes the second AlGaN region including the protrusions having a height of 7 nm or more.

This allows for obtaining sufficient current density required for oscillation of a laser diode that emits ultraviolet light and also increasing current density when electrons are injected from the first electrode.

(5) The nitride semiconductor element preferably includes the second AlGaN region in which the change rate of the Al composition ratio in the direction toward the tips of the protrusions is larger than the change rate of the Al composition ratio in the first AlGaN region 321.

This allows for efficient current flow from the second AlGaN region to the first AlGaN region, and can suppress increase in internal loss due to the absorption resulting from light leakage described above.

(6) The nitride semiconductor element preferably includes the second nitride semiconductor layer having a thickness of from 200 nm to less than 10 μm.

As a result, the unevenness due to the protrusions on the surface of the second AlGaN region is alleviated, and the adhesion between the AlGaN layer and the second nitride semiconductor layer is improved, which can improve current density, and can make it less likely to cause cracks in the second nitride semiconductor layer during manufacturing.

2. Second Embodiment

A nitride semiconductor element 2 according to a second embodiment will be described below with reference to FIGS. 3 and 4.

The nitride semiconductor element 2 is a laser diode capable of emitting ultraviolet light similarly to the nitride semiconductor element 1.

[Entire of Nitride Semiconductor Element]

Figure 3:
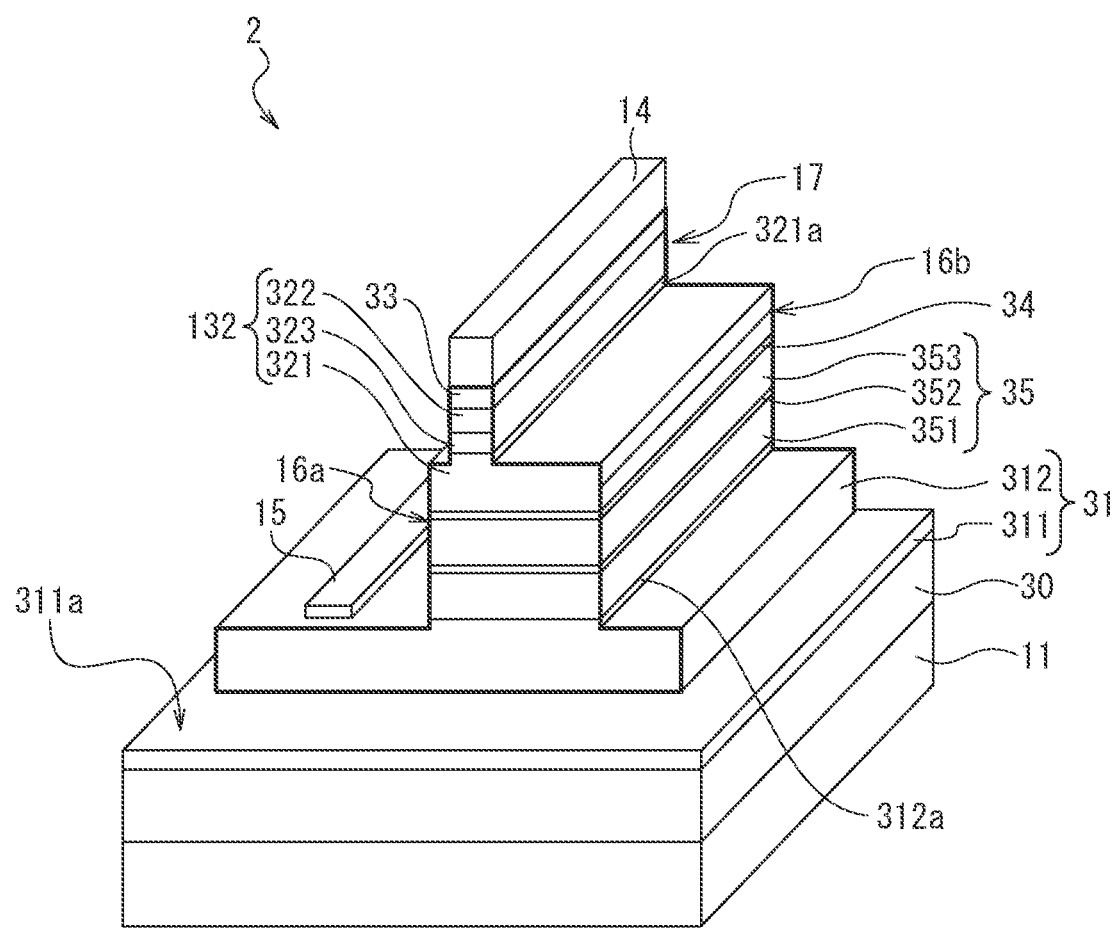
FIG. 3 is a perspective diagram illustrating a configuration example of a nitride semiconductor element according to a second embodiment of the present disclosure.

FIG. 3 is a perspective diagram schematically illustrating an example of a schematic configuration of the nitride semiconductor element 2 according to the present embodiment. FIG. 4 is a cross-sectional diagram illustrating the configuration of an AlGaN layer 132 included in the nitride semiconductor element 2.

As illustrated in FIG. 3, the nitride semiconductor element 2 has a configuration in which the AlN layer 30, the first nitride semiconductor layer 31, the light emitting portion 35 including the nitride semiconductor active layer 352, the electron block layer 34, an AlGaN layer 132, and the second nitride semiconductor layer 33 are stacked in this order on or above the substrate 11, which is similar to the nitride semiconductor element 1 according to the first embodiment. The nitride semiconductor element 2 also includes the first electrode 14 provided in contact with the second nitride semiconductor layer 33 and the second electrode 15 provided in contact with a part of the first nitride semiconductor layer 31. In other words, the nitride semiconductor element 2 is different from the nitride semiconductor element 1 according to the first embodiment in that the element 2 includes the AlGaN layer 132 including three regions instead of the AlGaN layer 32 formed by the two layer regions.

The AlGaN layer 132 of the nitride semiconductor element 2 will be described below with reference to FIG. 3. Additionally, each component other than the AlGaN layer 132 has the same configuration as that described in the first embodiment, and therefore the description thereof is omitted.

<AlGaN Layer>

Figure 4:
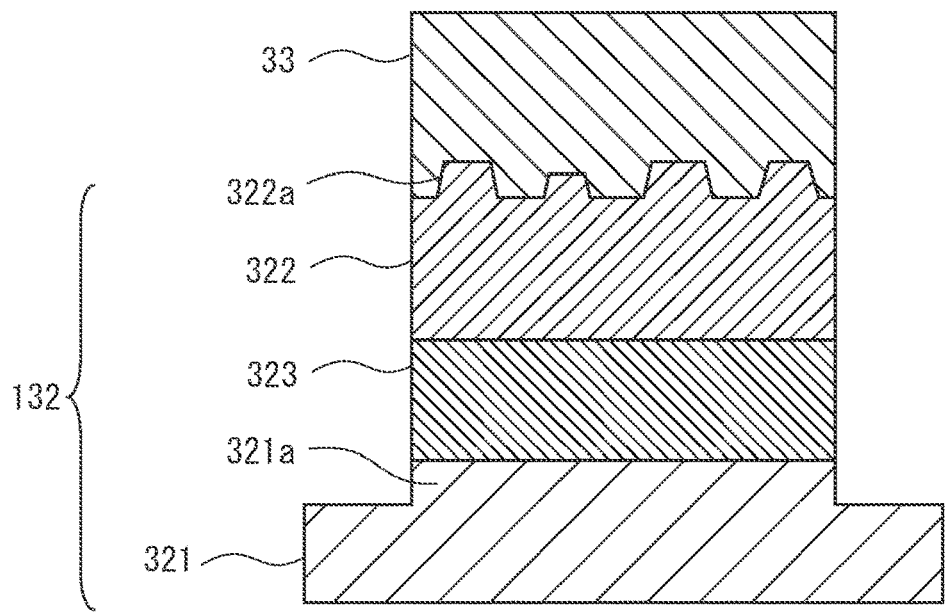
FIG. 4 is a cross-sectional diagram illustrating a configuration example of an AlGaN layer included in the nitride semiconductor element according to the second embodiment of the present disclosure.

FIG. 4 is a cross-sectional diagram illustrating a detailed configuration of the AlGaN layer 132. As illustrated in FIG. 4, the nitride semiconductor element 2 includes the AlGaN layer 132 including three regions different in change rate of Al composition ratio. The AlGaN layer 132 includes the first AlGaN region 321, a third AlGaN region 323, and the second AlGaN region 322. The second nitride semiconductor layer 33 covering the AlGaN layer 132 is provided on the upper surface of the AlGaN layer 132.

Each portion other than the third AlGaN region 323 is the same in configuration as each of the first AlGaN region 321, the second AlGaN region 322, and the second nitride semiconductor layer 33 described in the first embodiment, and therefore the description thereof is omitted.

(Third AlGaN Region)

The AlGaN layer 132 includes the third AlGaN region 323 provided between the first AlGaN region 321 and the second AlGaN region 322. The third AlGaN region 323 is formed of AlGaN. More specifically, the third AlGaN region 323 is formed of $Al_{x10}Ga_{(1-x10)}N$. The third AlGaN region 323 is formed to have a lower average Al composition ratio than in the first AlGaN region 321 and have a higher average Al composition ratio than in the second AlGaN region 322 (x2<x3<x1). Additionally, in the third AlGaN region 323, the Al composition ratio continuously varies in a thickness direction of the third AlGaN region 323.

As illustrated in FIG. 4, the third AlGaN region 323 is formed on the protruding region 321a formed on the first AlGaN region 321. The second AlGaN region 322 is formed on the third AlGaN region 323. The second nitride semiconductor layer 33 is formed on the second AlGaN region 322. The ridge semiconductor layer 17 is configured including the protruding region 321a formed on the first AlGaN region 321, the third AlGaN region 323, the second AlGaN region 322, and the second nitride semiconductor layer 33. However, as described in the first embodiment, the protruding region 321a (ridge portion) is intended for concentration of current, so that the nitride semiconductor active layer 352 and/or the first nitride semiconductor layer 31 may be included. Alternatively, the nitride semiconductor element 2 may have a structure such that without including the protruding region 321a in the first place, the AlGaN layer 132 is formed with the same area as a mesa region, and the first electrode 14 is designed to have an appropriate size to allow for current concentration.

In the nitride semiconductor element 2, the AlGaN layer 132 includes the third AlGaN region 323, whereby the first AlGaN region 321, the third AlGaN region 323, and the second AlGaN region 322 are arranged adjacent to each other in this order. In this case, in the AlGaN layer 132, a boundary where a change rate of the Al composition ratio in the AlGaN layer 132 changes is created between an end of the first AlGaN region 321 facing the nitride semiconductor active layer 352 side and an end of the second AlGaN region 322 on the arrangement side of the nitride semiconductor active layer 352. This enables the nitride semiconductor element 2 to improve light confinement. In terms of the change rate of the Al composition ratio, preferably, the third AlGaN region 323 is larger than the second AlGaN region 322, and the first AlGaN region 321 is larger than the third AlGaN region 323. As a result, an average Al composition ratio between the second AlGaN region 322 and the third AlGaN region 323 becomes higher than an Al composition ratio when the layers of the second and third AlGaN regions 322 and 323 are formed at a change rate (gradient) in the second AlGaN region 322. This improves light confinement efficiency in the nitride semiconductor element 2.

In addition, an Al composition ratio in an inflection surface between the second AlGaN region 322 and the third AlGaN region 323 is preferably 0.1 or more larger than an Al composition ratio in an inflection surface between the third AlGaN region 323 and the first AlGaN region 321. With this structure, the nitride semiconductor element 2 can achieve both light confinement and high currency density while suppressing increased drive voltage and increased element breakdown rate due to the thickness of the second AlGaN region 322 increased more than necessary.

In the present embodiment, the first AlGaN region 321 and the third AlGaN region 323 are formed in contact with each other, and the third AlGaN region 323 and the second AlGaN region 322 are formed in contact with each other, but this is merely illustrative. The AlGaN layer 132 may include an intermediate layer between the first AlGaN region 321 and the third AlGaN region 323 and between the third AlGaN region 323 and the second AlGaN region 322, respectively. The intermediate layer may be formed of, for example, $Al_wGa_{(1-w)}N$ (0<w<1) in which there is no composition change. Alternatively, the intermediate layer may have a stacked structure including $Al_wGa_{(1-w)}N$ in which there is no composition change and $Al_vGa_{(1-v)}N$ (0<v<w<1) in which there is no composition change (corresponding to a superlattice structure in the case of multiple stages).

As an example of the Al composition ratio w and the Al composition ratio v, w and v, respectively, may be 0.6 and 0.4. When the intermediate layer has the stacked structure, the Al composition ratio v and the Al composition ratio w may be the same as or different from values of Al composition ratios at end points of the respective AlGaN regions from the viewpoint of forming no energy barrier. When there is a difference between the Al composition ratios, it is preferable to have a structure with an Al composition ratio decreasing toward the upper layer from the viewpoint of efficiently transporting carriers to the light emitting layer. The intermediate layer may be of the same conductive type as the first AlGaN region 321, the third AlGaN region 323, and the second AlGaN region 322, i.e., a p-type semiconductor. Alternatively, the intermediate layer may be an undoped layer.

As described above, the nitride semiconductor element 2 according to the present embodiment includes the nitride semiconductor active layer 352 formed of $Al_{x8}Ga_{(1-x8)}N$ and the AlGaN layer 132 formed of $Al_xGa_{(1-x)}N$ in which the Al composition ratio x decreases in the direction away from the nitride semiconductor active layer 352. The AlGaN layer 132 includes the first AlGaN region 321 having a thickness of from more than 0 nm to less than 400 nm and the second AlGaN region 322, which is the region further away from the nitride semiconductor active layer 352 than is the first AlGaN region 321 and in which the change rate of the Al composition ratio x3 in the thickness direction of the film thickness of the AlGaN layer 132 is larger than in the first AlGaN region 321.

The nitride semiconductor element 2 having the above structure can improve maximum current density and can reduce voltage at a maximum current. This enables the nitride semiconductor element 2 to achieve high current density.

Furthermore, the AlGaN layer 132 included in the nitride semiconductor element 2 includes the third AlGaN region 323 in which the change rate of the Al composition ratio X3 is different from that in the second AlGaN region 322 in the region between the first AlGaN region 321 and the second AlGaN region 322. The third AlGaN region 323 is configured to have a lower average Al composition ratio x3 than in the first AlGaN region 321 and have a higher average Al composition ratio x3 than in the second AlGaN region 322. As a result, without thickening the first AlGaN region 321 more than necessary, low drive voltage, no element breakdown, and high current density can be achieved, as well as the laser oscillation threshold can be reduced.

<Effects of Second Embodiment>

The nitride semiconductor element according to the second embodiment has, in addition to the effects of the first embodiment, the following effects:

(7) The nitride semiconductor element includes the third AlGaN region provided between the first AlGaN region and the second AlGaN region.

As a result, in the nitride semiconductor element, the third AlGaN region creates the boundary where the change rate of the Al composition ratio changes between the first AlGaN region and the second AlGaN region, thereby enabling improved light confinement.

(8) The nitride semiconductor element includes the third AlGaN region formed to have a lower average Al composition ratio than in the first AlGaN region and have a higher average Al composition ratio than in the second AlGaN region.

This further improves light confinement efficiency in the nitride semiconductor element.

EXAMPLES

Hereinafter, the nitride semiconductor element according to the present disclosure will be described with reference to Examples.

In Examples, nitride semiconductor elements having the configuration described in the first embodiment were evaluated.

The configuration of a basic model of the nitride semiconductor element (see FIG. 1) in each Example is as follows. The nitride semiconductor element is a laser diode.

Note that, for example, the expression "$Al_{x \to y}$" in the following compositions indicates that the Al composition has gradually changed from x to y from a lower layer side to an upper layer side in the layer.

(Configuration of Basic Model)

An AlN layer, a first nitride semiconductor layer, a light emitting portion including a lower guide layer, an upper guide layer, and a nitride semiconductor active layer, an electron block layer, an AlGaN layer including a first AlGaN region and a second AlGaN region, and a second nitride semiconductor layer serving as a cover layer were formed on an upper surface of a substrate. Next, a first electrode provided in contact with the second nitride semiconductor layer and a second electrode provided in contact with a part of the first nitride semiconductor layer were formed. Here, each layer was formed in the following configuration.

Substrate: sapphire substrate
AlN layer: composition AlN (formed by a metal organic chemical vapor deposition (MOCVD)), thickness 1.6 μm
First nitride semiconductor layer: composition n-$Al_{0.55}Ga_{0.45}N$, thickness 3 μm
Light emitting layer: (double quantum well structure)
Well layer: composition u-$Al_{0.35}Ga_{0.65}N$, thickness 4 nm
Barrier layer: composition u-$Al_{0.45}Ga_{0.55}N$, thickness 8 nm
Lower guide layer and upper guide layer: composition u-$Al_{0.45}Ga_{0.55}N$, thickness 150 nm for each
Electron block layer: composition $Al_{0.9}Ga_{0.1}N$, thickness 20 nm
AlGaN layer
   First AlGaN region: composition p-$Al_{0.9 \to 0.45}Ga_{0.1 \to 0.55}N$, thickness 260 nm
   Second AlGaN region: composition p-$Al_{0.45 \to 0}Ga_{0.55 \to 1}N$, thickness (excluding protrusions) 30 nm
   Second nitride semiconductor layer: composition p-GaN,
Ridge semiconductor layer: width 5 μm
First electrode: width 3 μm Example 1

For the nitride semiconductor element of the above-described basic model, there were formed nitride semiconductor elements of configuration 1 and configuration 2 below having the configuration according to the present disclosure and a nitride semiconductor element of configuration 3 according to Comparative Example. Layers and portions with no configuration described were configured as in the basic model described above. Note that respective heights and thicknesses in configurations 1 to 3 can be controlled by appropriately setting a time for film deposition of the second AlGaN region and a time for film deposition of the second nitride semiconductor layer.

(Configuration 1)
Second AlGaN region: protrusion height 70 nm
Second nitride semiconductor layer: thickness 1000 nm
(Configuration 2)
Second AlGaN region: protrusion height 70 nm
Second nitride semiconductor layer: thickness 10 nm
(Configuration 3)
Second AlGaN region: protrusion height 0 nm (no protrusions)
Second nitride semiconductor layer: thickness 10 nm <Evaluation>

In the respective nitride semiconductor elements of configurations 1 to 3 as described above, the width of the ridge semiconductor layer and the width of the first electrode formed on the second nitride semiconductor layer were changed as shown in Table 1 below, and then maximum current densities Jmax of the respective nitride semiconductor elements were measured and compared.

Here, the maximum current density Jmax of each nitride semiconductor element was calculated based on a current value immediately before breakdown of the nitride semiconductor element by increasing a current amount of a current I flowing through the nitride semiconductor element while increasing stepwise at predetermined intervals a voltage value of an applied voltage Va applied between the first electrode and the second electrode. In calculating the maximum current density Jmax, it was determined that the nitride semiconductor element was broken down when voltage-current characteristics of the nitride semiconductor element deviated from a typical diode curve. Specifically, a current density based on the current I at a measurement point (immediately preceding measurement point) that was immediately before the deviation thereof from the diode curve was defined as the maximum current density Jmax because the voltage dropped and the current value became extremely high upon measurement of a measurement point next to a measurement point at which the maximum current density Jmax was obtained.

Table 1 below shows evaluation results. In Table 1, samples 1-1, 1-2, and 1-3, respectively, correspond to the nitride semiconductor elements of configurations 1, 2, and 3.

TABLE 1

|  | Second AlGaN region Protrusion height [nm] | Second nitride semiconductor layer Thickness [nm] | Ridge semiconductor layer Width [μm] | First electrode Width [μm] | Evaluation Maximum current density [kA/cm$^2$] |
|---|---|---|---|---|---|
| Sample 1-1 | 70 | 1000 | 5 | 3 | 114.1 |
| Sample 1-2 | 70 | 10 | 5 | 3 | 20.0 |
| Sample 1-3 | 0 | 10 | 5 | 3 | 10.9 |

As illustrated in Table 1, the nitride semiconductor element (sample 1-1) of configuration 1 was able to achieve a significantly high maximum current density compared with the nitride semiconductor elements (samples 1-2 and 1-3) of the other configurations. This is thought to be because local concentration of current is suppressed by the protrusions provided on the side of the second AlGaN region facing the second nitride semiconductor layer, thereby achieving uniform current injection.

The above results show that it is preferable to provide the protrusions on the second AlGaN region, and also more preferable to form the second nitride semiconductor layer thicker than the protrusions.

Example 2

For the nitride semiconductor element of the above-described basic model, the thickness of the nitride semiconductor element was set to 10 nm, and the protrusion height of the second AlGaN region was varied as shown in Table 2 to evaluate a maximum current density. Layers and portions with no configuration described were configured as in the basic model described above. Note that the protrusion height was adjusted by varying the time for film deposition of the second AlGaN region.

Figure 5:
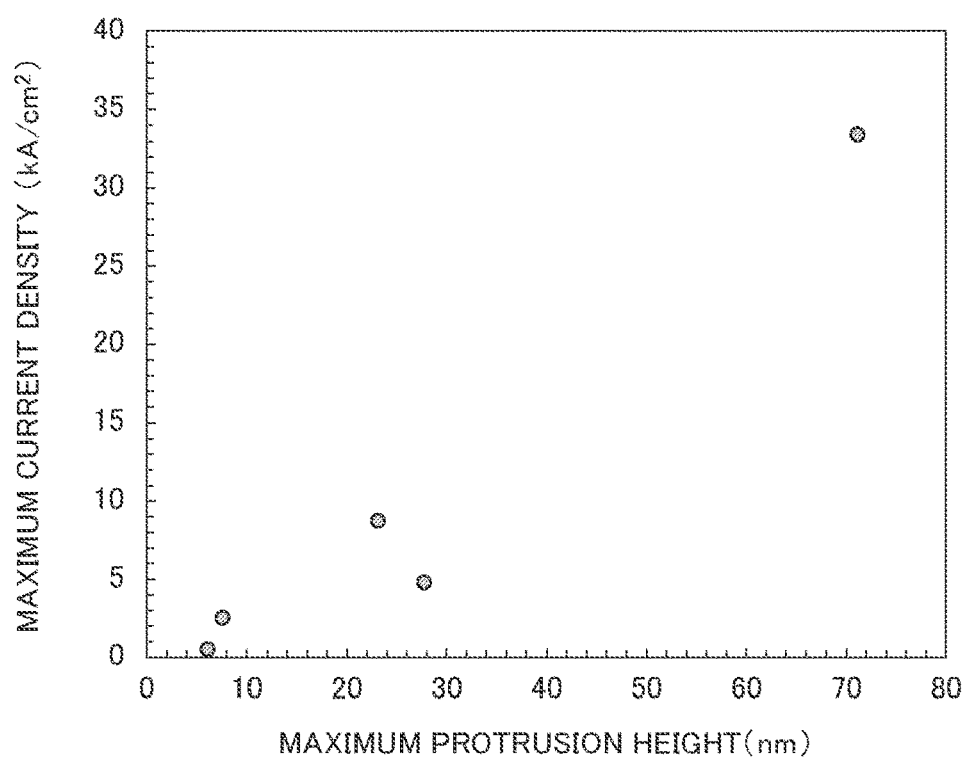
FIG. 5 is a graph illustrating a maximum current density of each sample in Example 2 of the present disclosure.
Figure 6:
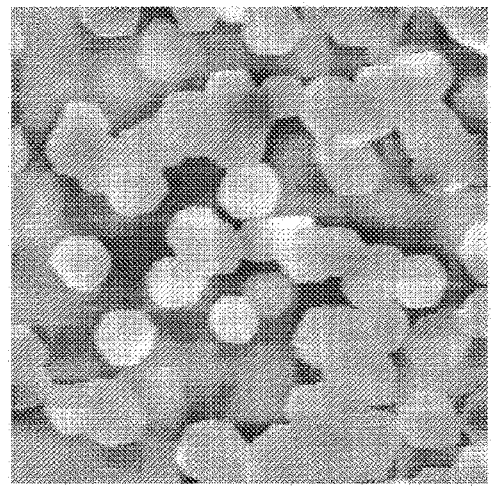
FIG. 6 is an image, measured by an atomic force microscope (AFM), of a surface shape of a second AlGaN region included in a nitride semiconductor element of sample 2-5 in Example 2 of the present disclosure.

FIG. 5 is a graph illustrating the maximum current density of each sample. Additionally, FIG. 6 is an image, measured by an atomic force microscope (AFM), of a surface shape of the second AlGaN region included in a nitride semiconductor element of sample 2-5. FIG. 6 illustrates the image of a square region with a side length of 10 μm.

As illustrated in Table 2, there was a tendency for the maximum current density to increase as the protrusion height of the second AlGaN region was higher. In general, it is said that oscillating an ultraviolet light laser diode requires a current density of at least 1 kA/cm$^2$ or more. In other words, the maximum current density improved into a preferable range when the protrusion height was 7 nm or more.

In addition, as illustrated in FIG. 6, the surface shape of the second AlGaN region in sample 2-5 having a protrusion height of 70 nm was hexagonal in plan view.

Example 3

For the nitride semiconductor element of the above-described basic model, the thickness of the second nitride semiconductor layer covering the second AlGaN region including a protrusion height of 7 nm was varied as shown in Table 3 to evaluate root mean square (RMS) height (root mean square height (Rq)) of surface flatness of the second nitride semiconductor layer. Layers and portions with no configuration described were configured as in the basic model described above.

Figure 7:
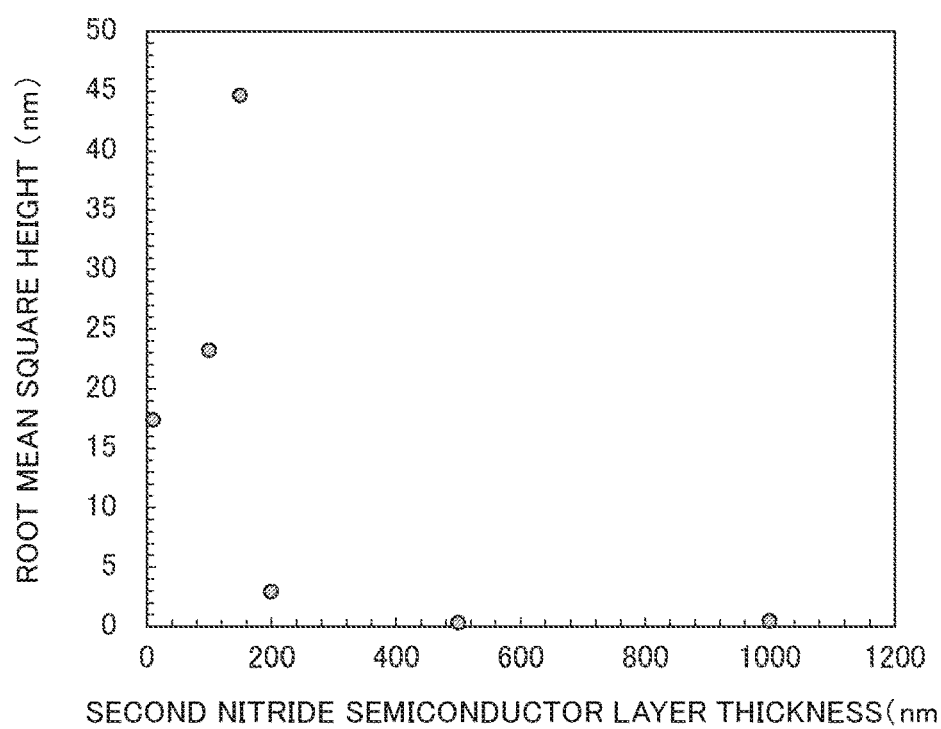
FIG. 7 is a graph illustrating a root mean square height of each sample in Example 3 of the present disclosure.

FIG. 7 is a graph illustrating the root mean square height of each sample. Here, the root mean square height Rq of the surface of the second nitride semiconductor layer was calculated based on the AFM image of the surface of the second nitride semiconductor layer. Additionally, in the present Example, the root mean square height Rq of the surface of the second nitride semiconductor layer was calculated without forming the ridge semiconductor layer and the first electrode.

TABLE 2

|  | Second AlGaN region Protrusion height [nm] | Second nitride semiconductor layer Thickness [nm] | Ridge semiconductor layer Width [μm] | First electrode Width [μm] | Evaluation Maximum current density [kA/cm$^2$] |
|---|---|---|---|---|---|
| Sample 2-1 | 6.1 | 10 | 5 | 3 | 0.5 |
| Sample 2-2 | 7.5 |  |  |  | 2.5 |
| Sample 2-3 | 23 |  |  |  | 8.9 |
| Sample 2-4 | 27.5 |  |  |  | 4.8 |
| Sample 2-5 | 70 |  |  |  | 33.0 |

TABLE 3

| | Second AlGaN region Protrusion height [nm] | Second nitride semiconductor layer Thickness [nm] | Evaluation Root mean square height Rq [nm] |
|---|---|---|---|
| Sample 3-1 | 70 | 10 | 17.0 |
| Sample 3-2 | | 100 | 23.0 |
| Sample 3-3 | | 150 | 44.5 |
| Sample 3-4 | | 200 | 2.9 |
| Sample 3-5 | | 500 | 0.1 |
| Sample 3-6 | | 1000 | 0.1 |

As illustrated in Table 3, the flatness of the second nitride semiconductor layer increased as the thickness of the second nitride semiconductor layer was thicker.

Particularly, when the protrusion height was 70 nm, the root mean square height Rq of the surface of the nitride semiconductor layer increased until the thickness of the second nitride semiconductor layer was 150 nm. On the other hand, when the thickness of the second nitride semiconductor layer was 200 nm or more, the root mean square height Rq of the surface of the nitride semiconductor layer remarkably decreased, and when the thickness thereof was 500 nm or more, the unevenness became especially small. This is because when the second nitride semiconductor layer is formed, the layer grows so that the unevenness of the surface of the second AlGaN region decreases as the thickness of the layer increases. As the surface of the second nitride semiconductor layer is flatter, coverage of the protrusions by the electrode improves, which is advantageous for uniform current injection. This shows that the preferable thickness of the second nitride semiconductor layer is 200 nm or more. However, a stacked thickness of 5 μm or more can cause cracking, so that preferred is less than 5 μm.

While some embodiments of the present invention have been described, the technological scope of the invention is not limited to the technological scope described in the above-described embodiments. Various changes or improvements can be added to the above-described embodiments, and it is apparent from the claims that those added with such changes or improvements can also be included in the technological scope of the present invention.

REFERENCE SIGNS LIST 1, 2: Nitride semiconductor element
11: Substrate
14: First electrode
15: Second electrode
16a: Resonator surface
16b: Backside resonator surface
17: Ridge semiconductor layer
31: First nitride semiconductor layer
32: AlGaN layer
33: Second nitride semiconductor layer
34: Electron block layer
35: Light emitting portion
311: First stacked portion
311a: Upper surface
312: Second stacked portion
312a, 321a: Protruding region
321: First AlGaN region
322: Second AlGaN region
322a: Protrusion
323: Third AlGaN region
351: Lower guide layer
352: Nitride semiconductor active layer
353: Upper guide layer

The invention claimed is:

1. A nitride semiconductor element, comprising:
an active layer;
an electron block layer formed above the active layer;
an AlGaN layer formed on the electron block layer; and
a cover layer covering an upper surface of the AlGaN layer and formed of AlGaN or GaN having a lower Al composition ratio than in the AlGaN layer,
wherein the AlGaN layer has a first AlGaN region and a second AlGaN region, and the second AlGaN region includes protrusions provided on a surface opposite to the active layer, and the cover layer covers the protrusions,
wherein a composition of the first AlGaN region is $Al_{x1}Ga_{(1-x1)}N$, where $0.45 < x1 \leq 0.9$,
wherein a composition of the second AlGaN region is $Al_{x2}Ga_{(1-x1)}N$, where $0 < x \leq 0.45$, and
wherein the entire second AlGaN region including the protrusions have an Al composition ratio decreasing in a direction away from the active layer toward tips of the protrusions.

2. The nitride semiconductor element according to claim 1, wherein the protrusions have a frustum shape.

3. The nitride semiconductor element according to claim 1, wherein the protrusions have a height of 7 nm or more.

4. The nitride semiconductor element according to claim 1, wherein the cover layer has a thickness of from 200 nm to less than 10 μm.

5. The nitride semiconductor element according to claim 1, wherein the second AlGaN region is further away from the active layer than is the first AlGaN region, and
wherein an average Al composition ratio in the second AlGaN region is lower than an average Al composition ratio in the first AlGaN region.

6. The nitride semiconductor element according to claim 5, wherein a change rate of the Al composition ratio in the second AlGaN region is larger than a change rate of the Al composition ratio in the first AlGaN region.

7. The nitride semiconductor element according to claim 5, wherein the first AlGaN region has a thickness of from more than 0 nm to less than 400 nm.

8. The nitride semiconductor element according to claim 5, wherein the first AlGaN region contains Mg.

9. The nitride semiconductor element according to claim 5, wherein, in each of the first AlGaN region and the second AlGaN region, the Al composition ratio continuously varies in a thickness direction of each of the regions.

10. A nitride semiconductor element, comprising:
an active layer;
an electron block layer formed above the active layer;
an AlGaN layer formed on the electron block layer; and
a cover layer covering an upper surface of the AlGaN layer and formed of AlGaN or GaN having a lower Al composition ratio than in the AlGaN layer,
wherein the AlGaN layer has a first AlGaN region and a second AlGaN region,
wherein the first AlGaN region has a first composition, where the first composition is $Al_{x1}Ga_{(1-x1)}N$, where $0.45 < x1 \leq 0.9$,
wherein the second AlGaN region has a second composition, where the second composition is $Al_{x2}Ga_{(1-x2)}N$, where $0 < x2 \leq 0.45$,
wherein the second AlGaN region includes a plurality of protrusions having a tip, the plurality of protrusions provided on a surface of the second AlGaN region opposite to the active layer, wherein the cover layer covers the plurality of protrusions, wherein each of the plurality of protrusions is formed of the second composition, and wherein the entire second AlGaN region including the protrusions have an Al composition ratio decreasing toward the tip.

11. The nitride semiconductor element according to claim 10, wherein the protrusions have a frustum shape.

12. The nitride semiconductor element according to claim 10, wherein the protrusions have a height of 7 nm or more.

13. The nitride semiconductor element according to claim 10, wherein the cover layer has a thickness of from 200 nm to less than 10 μm.

14. The nitride semiconductor element according to claim 10, wherein the second AlGaN region is further away from the active layer than is the first AlGaN region, and wherein an average Al composition ratio in the second AlGaN region is lower than an average Al composition ratio in the first AlGaN region.

15. The nitride semiconductor element according to claim 14, wherein a change rate of the Al composition ratio in the second AlGaN region is larger than a change rate of the Al composition ratio in the first AlGaN region.

16. The nitride semiconductor element according to claim 14, wherein the first AlGaN region has a thickness of from more than 0 nm to less than 400 nm.

17. The nitride semiconductor element according to claim 14, wherein the first AlGaN region contains Mg.

18. The nitride semiconductor element according to claim 14, wherein, in each of the first AlGaN region and the second AlGaN region, the Al composition ratio continuously varies in a thickness direction of each of the regions.

19. The nitride semiconductor element according to claim 18, wherein the Al composition ratio is consistent in an interface between the first AlGaN region and the second AlGaN region in contact with each other.

20. The nitride semiconductor element according to claim 9, wherein the Al composition ratio is consistent in an interface between the first AlGaN region and the second AlGaN region in contact with each other.

* * * * *